United States Patent [19]

Takami et al.

[11] 4,135,038

[45] Jan. 16, 1979

[54] SEAL STRUCTURE OF CERAMICS AND LOW EXPANSION METALLIC MATERIAL

[75] Inventors: Akio Takami; Kazuo Kondo; Kazutoshi Tanaka, all of Nagoya, Japan

[73] Assignee: NGK Spark Plug Co., Ltd., Nagoya, Japan

[21] Appl. No.: 862,326

[22] Filed: Dec. 20, 1977

[30] Foreign Application Priority Data

Dec. 20, 1976 [JP] Japan .............................. 51-153146

[51] Int. Cl.² ...................... B32B 17/06; B32B 15/04
[52] U.S. Cl. .................... 428/427; 428/428; 428/433; 428/471; 428/472; 428/901
[58] Field of Search ............... 428/433, 427, 428, 471, 428/472, 901

[56] References Cited

U.S. PATENT DOCUMENTS

| | | | |
|---|---|---|---|
| 2,458,748 | 1/1949 | Stuparoff | 428/433 |
| 3,225,132 | 12/1965 | Baas | 428/433 |
| 3,250,631 | 5/1966 | Lusher | 106/52 |
| 3,258,350 | 6/1966 | Martin | 106/47 |
| 3,404,027 | 10/1968 | Kosiorek | 428/427 |
| 3,560,327 | 2/1971 | Mills | 428/428 |
| 3,676,204 | 7/1972 | Eppler | 428/428 |
| 3,679,464 | 7/1972 | Eppler | 428/428 |
| 3,804,666 | 4/1974 | Eppler | 428/428 |
| 3,846,222 | 11/1974 | Dietz | 428/325 |
| 3,922,471 | 11/1975 | Ellis | 428/427 |
| 4,002,799 | 1/1977 | Dumesnill | 428/428 |

*Primary Examiner*—Ellis Robinson
*Attorney, Agent, or Firm*—Sughrue, Rothwell, Mion, Zinn and Macpeak

[57] ABSTRACT

A seal structure consisting of a ceramic base and a low-expansion metallic material bonded by a low-melting glass particularly useful for large scale integrated circuit (LSI) applications is disclosed. When using a high alumina ceramics containing 65 to 92% of $Al_2O_3$ by weight as a ceramic, the thermal coefficients of expansion are best matched while maintaining a comparatively low dielectric constant by using a composition consisting of 60 to 85% lead borate glass, 10 to 30% $\beta$-eucryptite and 0.5 to 15% zircon as a low-melting sealing glass.

7 Claims, 2 Drawing Figures

SEAL STRUCTURE OF CERAMICS AND LOW EXPANSION METALLIC MATERIAL

SUMMARY OF THE INVENTION

This invention relates to a seal structure consisting of a ceramic base and a low-expansion metallic material bonded by a low-melting glass such as solder glass or low temperature solder glass. More particularly, according to the invention a high alumina ceramics containing 65 to 92% of $Al_2O_3$ as a ceramic base and cap and a composition consisting of 60 to 85% lead borate glass (frit), 10 to 30% $\beta$-eucryptite and 0.5 to 15% zircon (total 100%) as a low-melting sealing glass are used in sealing an especially large-scale high alumina ceramic member such as a large scale integrated circuit (LSI) package and a low-expansion metallic material such as Kovar (trade mark of Westinghouse Electric Corp. for an iron-nickel-colbalt alloy) having many pins or a large area by means of the low melting glass.

DETAILED DESCRIPTION OF THE INVENTION

Figure 1:
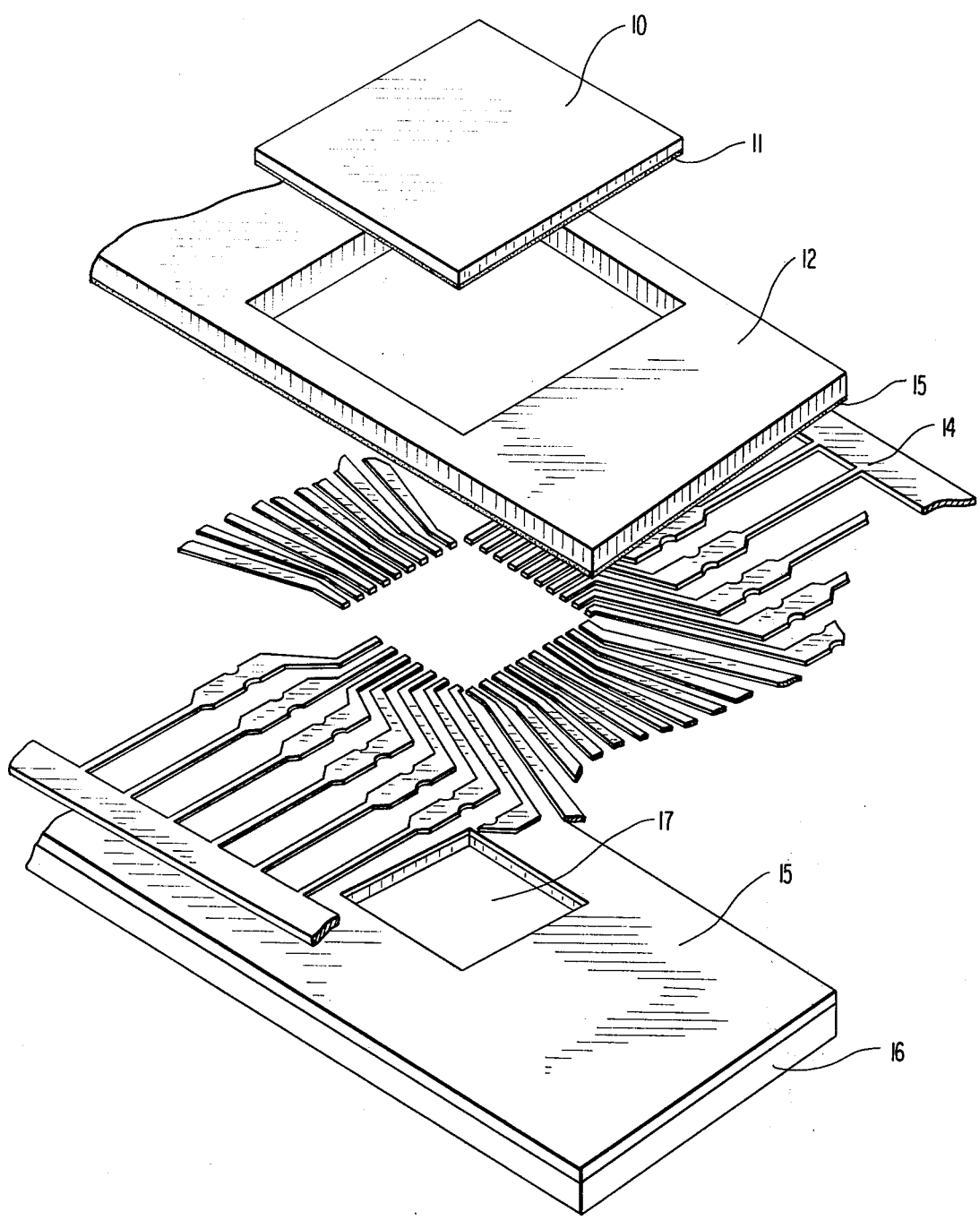
FIG. 1 is an exploded view of an LSI package.
Figure 2:
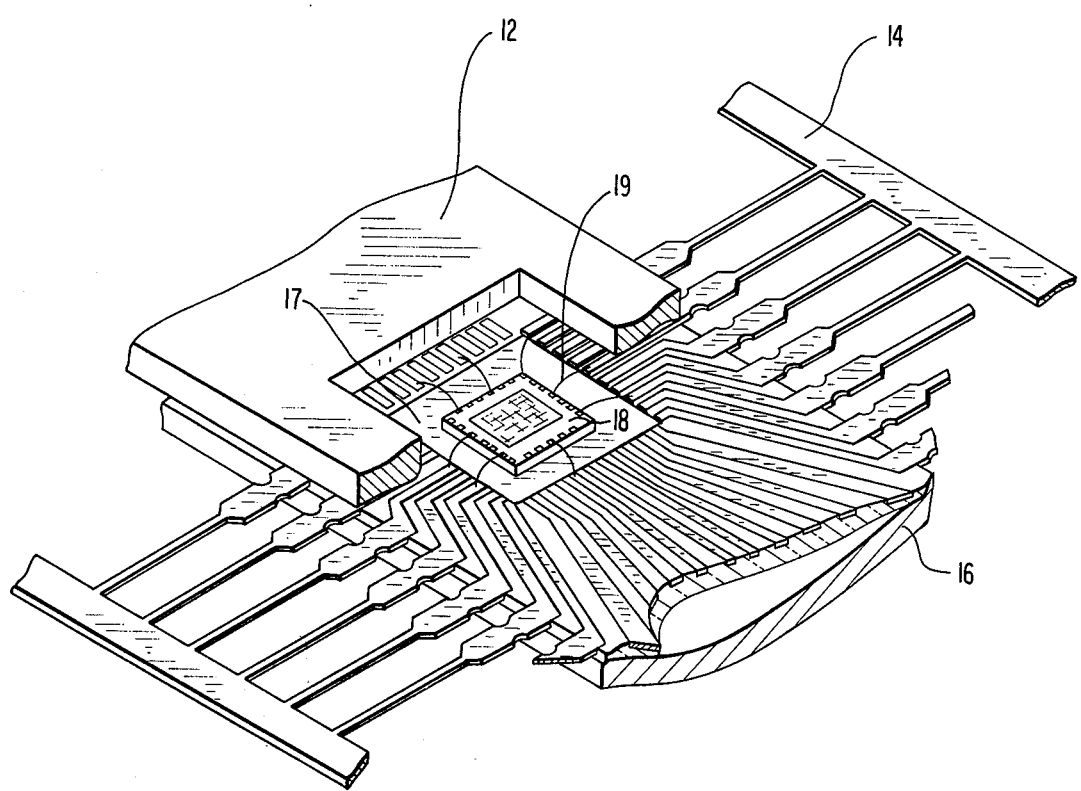
FIG. 2 is a partially cut-away view of an assembled LSI package.

This invention relates to a seal structure shown in FIGS. 1 and 2. Such seal structure is utilized for packaging many types semiconductors as disclosed in Charles A. Harper, *Handbook of Electric Packaging*, McGraw Hill (1969) Chapter 9 — pages 27-28 and Morton L. Popfer, *Thick-Film Microelectronics*, Van Nostrand/Reinhold Company (1971), pages 124-136. That is, metal lead frame 14 such as Kovar or 42 Ni/Fe alloy between an alumina ceramics base 16 and an alumina ceramics frame 12 is sealed by using a low-melting glass 15. The alumina ceramics base 16 is illustrated as being formed with a cavity at the central part of the base. The surface of the cavity is covered by a gold metallization 17, and semiconductor elements 18 are set on the gold metallization 17 in the cavity by using Die Bonding in the conventional manner as disclosed at pages 99 to 107 in Jopfer text referenced above. And then, the semiconductor elements are connected to metal lead frame 14 by using aluminium wire 19 having a diameter of 25 $\mu$m.

Ceramic or metal cap 10 is adhered to the ceramic frame 12 by using a low-melting glass or epoxy resin 11. Thus, the semiconductor elements are wholly encapsulated and protected.

The bonding strength or hermeticity is effected by mismatching the coefficient of thermal expansion among low-melting glass, ceramic substrate and Kovar lead frame. When the bonding is performed with the lead frame of Kovar interposed between the high alumina ceramic base plate and frame, the coefficient of thermal expansion of the low-melting glass must be matched both with that of the high alumina ceramics and metal lead frame. Thus, various investigations have been performed.

Sealing techniques between #7052 glass (Corning, U.S.A.) and Kovar metal are well known as disclosed by Walter H. Kohl, *Materials Technology for Electron Tubes*, Reinhold (1951), at pp. 52 to 100. #7052 glass comprises $SiO_2$ 64.2 wt%, $B_2O_3$ 18 wt%, $Al_2O_3$ 8.4 wt%, BaO 3.1 wt%, $Na_2O$ 1.9 wt%, $K_2O$ 3.9 wt% and $Li_2O$ 0.5 wt%.

However, further complex stress strain occur in the structure of FIG. 1 using ceramics in addition to the above. It can be understood from page 130 of the Jopfer text referenced above that alumina content in the alumina ceramics in the structure of FIG. 1 which comprises #7052 glass, alumina ceramics and Kovar lead frame is 87 to 95 wt%. Nevertheless, the #7052 glass used here requires a high temperature of about 1000° C in order to form the seal structure and, further, a furnace and a jig which can resist the high temperatures are required.

On the other hand, $PbO$-$ZnO$-$B_2O_3$ type crystallizing solder glass can be sealed at about 500° C. The seal structure using this glass is well known as CER-DIP. It is well known as disclosed by T. H. Ramsey, Jr. in "Critical Parameters in Glass Sealed Ceramic Packages," *Solid State Technology*, Sept. 1974, at pp. 51 to 55, that the reliability of CER-DIP depends on the degree of crystalization of the glass and is not stable. (Content of alumina ceramic in the case is 94 wt%.) Thus, a seal structure having high stability could not be obtained.

The other hand, integrated circuits have become large-scaled (LSI) with an increasing degree of integration, and the present trend is to even larger-scale integrated circuits. Hence, the ceramic portion including the high alumina ceramic base plate and frame becomes larger in size, and the lead frame has more than 40 pins in contrast to about 16 pins in the previous lead frame. Matching of the thermal expansion coefficients of the ceramic materials, the lead frame of low expansion made of, for example, Kovar alloy, and the low-melting glass is even more critical than as described on page 135 in the text by Jopfer referenced above.

In an attempt to overcome this disadvantage, a sealing glass which consists of a lead borate glass of low melting point and lead titanate ceramic powder as a filler having a negative coefficient of thermal expansion was developed either alone or together with zircon.

However, in Japanese Patent Application Open to Public Inspection No. 33112/1976, forsterite is used for ceramics and only sealing techniques between glass and ceramics are disclosed. Further, Japanese Patent Publication No. 41083/1974 only teaches the techniques of sealing between tungsten wires and glass. This glass besides was not entirely satisfactory for some reasons. For example, since lead titanate has a high dielectric constant, signal transmission delays in LSI devices cannot be ignored for high speed applications as discussed by D. L. Wilcox "Ceramics for Packaging," *Solid State Technology*, January 1971, page 42. A zircon powder has a comparatively low dielectric constant, and is used to remove this defect. But zircon has a higher coefficient of thermal expansion than lead titanate; therefore, a large volume of zircon powders must be added to adjust expansion mismatch among the materials (ceramic, lead and glass), but then the maximum amount which can be added is restricted in view of poor glass flow during sealing.

The low-melting glass containing $\beta$-eucryptite having a minus thermal expansion coefficient is effective to adjust the thermal expansion coefficient. Japanese Patent Application Open to Public Inspection No. 103613/1973 teaches that a particle size of 40 $\mu$m or less of $\beta$-eucryptite is suitable as the sealing glass for CER-DIP containing 91% of alumina ceramics.

However, as is known from the experiments by the present inventors, an excess amount of β-eucryptite makes the insulating property of the glass worse. Especially, Li ion of β-eucryptite is easily diffused into the glass under high temperature and high moisture with charging direct current.

In any event, it is impossible in the prior arts to adjust completely the mismatch amoung ceramics, metal lead frame and sealing glass. In addition, electrical properties of the seal glass could not improved by the prior arts.

The present invention provides a seal structure of ceramics and a low-expansion metallic material, comprising high alumina ceramics having an $Al_2O_3$ content of 65 to 92% by weight as a base plate, frame plate and a metal lead frame such as Kovar alloy bonded to each other by a low-melting glass consisting of 60 to 85% by weight of a low-melting glass frit of the lead borate type, 10 to 30% by weight of β-eucryptite and 0.5 to 15% by weight of zircon, the total proportion of the glass ingredients being 100% by weight.

The high alumina ceramics having an $Al_2O_3$ content of as high as 65 to 92% by weight are used in this invention because of their characteristic high mechanical strength, heat conductivity and thermal expansion coefficient. If the alumina content is less than 65%, the lower limit, the required mechanical strength cannot be obtained, the heat conductivity is insufficient, and pinholes tend to form. On the other hand, if the alumina content exceeds 92% by weight, the upper limit, the coefficient of thermal expansion of the ceramics becomes large, and it is difficult to match it with those of the other materials. Furthermore, firing temperature of the alumina ceramics becomes higher. The remainder in a proportion of 8 to 35% consists of known sintering promoters such as $SiO_2$, MgO, CaO and BaO as subsidiary ingredients. The most preferred ingredient is $SiO_2$ which reacts with $Al_2O_3$ and forms low-expansion minerals such as mullite. It is preferably added together with MgO, CaO, BaO, etc. Small amounts of coloring ingredients such as $TiO_2$, $MnO_2$, $Fe_2O_3$ or $Co_3O_4$ may also be added.

In producing the alumina ceramics, a mineralizer can be added in the amount of 6.8 wt.% or less, which amount is to the total amount of 100 wt% of $Al_2O_3$ 78 wt% and $SiO_2$ 22 wt%, at the time of mixing raw materials. The mineralizer comprises, for example, MgO 18.6 wt%, CaO 11.6 wt%, $B_2O_3$ 29 wt% and the balance $SiO_2$. In order to prepare each composition of ceramics as set forth in Table 1, the raw materials, the mineralizer above and a small amount of additives are uniformly mixed by wet-grinding with a ball mill or the like. The slurry mixed is dried and made to powders by using a spray dry method or the like. The powder obtained is molded by using a metal mould under a pressure of 700 to 1200 kg/cm². The molded base ceramics is sintered by using a tunnel kiln or the like under a temperature of about 1400 - 1500° C for 30 hours to produce the alumina ceramics.

A low-melting glass composition consisting of a low-melting glass powder of the lead borate type β-eucryptite powder and zircon powder as a filler is used for sealing a low-expansion metallic material such as Kovar alloy or Ni/Fe (40-46 wt% of Ni) alloy to said ceramic material. The Kovar alloy (27-31% Ni, 15-19% Co, the balance Fe) shows a coefficient of thermal expansion of as low as about $50 \times 10^{-7}$ at a temperature up to about 400° C, and then abruptly increases at the transformation temperature. A nickel-iron alloy (40 to 46 wt% of Ni) also shows the coefficient of thermal expansion under the same condition. The high coefficient of thermal expansion of the glass is reduced by the addition of β-eucryptite powder and zircon powder, especially the β-eucryptite, which has an extremely negative coefficient of thermal expansion. The mechanical strength of the glass is enhanced by zircon. Therefore sealing glasses with zircon powder are endurable against stresses based on expansion mismatches. Such a glass composition can compensate for the expansion mismatch among the ceramic materials, the low-expansion metallic material and the low-melting glass itself whose coefficients of thermal expansion are difficult to match.

A suitable composition of the lead borate glass is a $PbO-B_2O_3-ZnO$ glass powder consisting of 65-90% PbO, 3-30% $B_2O_3$ and 1-30% ZnO which is widely known. The properties of this glass are a coefficient of thermal expansion $\alpha = 80 \times 10^{-7}$ to $130 \times 10^{-7}$ °C$^{-1}$ and glass transformation temperature of 250 to 400° C. An especially preferred composition comprises 68–82% PbO, 6–12% $B_2O_3$ and 7–18% ZnO. A part or all the ZnO can be replaced by a known oxide for lead borate glass of this kind, such as $SiO_2$, $Al_2O_3$, BaO or $Na_2O$. Since the lead borate glass intrinsically has a high coefficient of thermal expansion of about $110 \times 10^{-7}$, its amount in the glass composition is limited to 85% at most. If the amount exceeds this limit, the coefficient of thermal expansion of the glass cannot be reduced to the desired value even by the addition of β-eucryptite, powder ($Li_2O.Al_2O_3.2SiO_2$) (particle size 40 μm or less, preferably 2 μm to 15 μm) and zircon powder ($ZrO_2.SiO_2$) (particle size 10 μm or less), and a difference in thermal expansion occurs between the low-melting glass and the metal lead frame. Here, if the particle size of β-eucryptite is too fine, the insulation property of glass is worsened since the β-eucryptite is disolved into the glass. While, if the particle size of β-eucryptite is too large, microcracks occur in the glass. On the other hand, a particle size of zircon on the order of 10 μm or less is suitable since the zircon is hardly disolved in the glass. If the amount of the lead borate glass is less than 65%, β-eucryptite and zircon fillers in the sealing glasses make glass flow decrease and hermetic enclosure with solder glass cannot be obtained as a result, and the thermal expansion coefficient of the resulting glass composition becomes lead frame and the resulting stress also destroys the hermiticity of said enclosure. Thus, amounts outside the range of 65 to 85% by weight are infeasible.

The β-eucryptite reduces the high coefficient of thermal expansion of the lead borate glass by its highly negative coefficient of thermal expansion. Furthermore, because of its low dielectric constant, the β-eucryptite reduces signal transmission delays when it is intended for LSI applications. If the amount of β-eucryptite is less than 10% by weight, its effect is insufficient. On the other hand, if the amount exceeds 30%, its extremely low coefficient of thermal expansion of $-120 \times 10^{-7}$ reduces the coefficient of thermal expansion of the lead borate glass to far below that of the high alumina ceramic material, and the product has no practical utility as above described.

Zircon by its coefficient of thermal expansion of about $145 \times 10^{-7}$ which is substantially equal to that of the low-expansion metal such as Kovar alloy, reduces the thermal expansion of the lead borate glass. Furthermore, zircon serves to increase the strength of the glass and to prevent cracking, breakage, etc. of the glass which results from the complicated stress caused by slight differences in thermal expansion which is present among the glass, the high alumina ceramic material and the metal lead frame. If the amount of zircon is less than 0.5% by weight, its effect is poor, and on the other hand, if it exceeds 15% by weight, glass flow during sealing is adversely diminished, and the required seal strength cannot be obtained.

EXAMPLE

A commercially available 0.25mm-thick lead frame made of Kovar alloy and including 40 pins was sealed to a ceramic base plate consisting mainly of $Al_2O_3$ and having a size of 13mm in length, 50.5mm in width, and 2mm in thickness and a ceramic frame having the same quality as the base plate, the same length and width as the base plate and a thickness of 1.3mm and including at its central portion a square hole with a size of 9mm in length and 11.5mm in width by conventional method (refer to the article by Ramsey referenced above) using a low-melting glass which consisted of varying proportions as tabulated below of lead borate glass (average particle size 4 μm), β-eucryptite (average particle size 5 μm) and zircon (average particle size 0.7 μm) to form samples of a seal structure (seal structure of FIG. 2) with a seal glass thickness of 300 to 400 microns.

The manner of producing and the properties of lead borate glass used in the example are as follows. First, lead oxide or fluoride, boric acid, silica and zinc oxide are prepared in order to make the composition. Composition of glass: PbO 77%, $Al_2O_3$ 3%, $B_2O_3$ 12%, $SiO_2$ 1%, ZnO 7%. And then, after melting the prepared materials in a platinum crucible at about 800° C for 60 min., the melted materials are molded in a plate figure and cooled. Then, the plate figure material is ground to the size of 150 mesh (105 μm) or less. The properties of glass obtained are coefficient of thermal expansion $\alpha = 110 \times 10^{-7}$ °$C^{-1}$ (30 - 250° C), transformation temperature of 280° C and yielding temperature of 315° C.

IC packages, as shown in FIG. 2, formed in such manner were dipped for 5 minutes in hot water at 100° C, and rapidly cooled for 5 minutes in cold water at 0° C. This thermal shock cycle was repeated 15 times (MIL-STD-883-1011 condition A), and the state of the occurrence of cracks in the seal glass layer was examined under fluorescent light by microscope. In each run, ten samples were used, and the results are tabulated below.

Table 1

| No. | Composition of ceramics (wt %) $Al_2O_3$ | Composition of ceramics (wt %) $SiO_2$ | Composition of Low-melting glass (wt %) lead-borate glass | Composition of Low-melting glass (wt %) β-eucryptite | Composition of Low-melting glass (wt %) zircon | Thermal shock test (the state of occurrence of cracks in the sealing glass layer | Electro-static capacity between nearest leads | Remarks |
|---|---|---|---|---|---|---|---|---|
| 1 | 78 | 22 | 58 | 30 | 12 | Cracks occurred in all samples | | Content of the lead borate glass outside the specified range |
| 2 | 78 | 22 | 60 | 30 | 10 | Cracks occurred in 3/10 of samples | | |
| 3 | 78 | 22 | 65 | 20 | 15 | No crack occurred in all samples | | |
| 4 | 78 | 22 | 72 | 20 | 8 | " | | |
| 5 | 78 | 22 | 72 | 27.5 | 0.5 | " | | |
| 6 | 78 | 22 | 72 | 13 | 15 | " | | |
| 7 | 78 | 22 | 80 | 15 | 5 | " | | |
| 8 | 78 | 22 | 80 | 18.5 | 0.5 | " | | |
| 9 | 78 | 22 | 80 | 10 | 10 | " | | |
| 10 | 78 | 22 | 85 | 10 | 5 | " | 5.3pf | |
| 11 | 78 | 22 | 85 | 14.5 | 0.5 | " | | |
| 12 | 78 | 22 | 85 | 12 | 3 | " | | |
| 13 | 78 | 22 | 88 | 10 | 2 | Cracks occurred in all samples | | Content of the lead borate glass outside the specified range |
| 14 | 78 | 22 | 64 | 33 | 3 | " | | Content of β-eucryptite outside the specified range |
| 15 | 78 | 22 | 79 | 8 | 13 | " | | " |
| 16 | 78 | 22 | 67 | 15 | 18 | Cracks occurred in 2/10 of samples | | Content of zircon outside the specified range |
| 17 | 78 | 22 | 75 | 24.5 | 0.2 | Cracks occurred in all samples | | " |
| 18 | 60 | 40 | 72 | 20 | 8 | " | | Alumina content of ceramics outside the specified range |
| 19 | 65 | 35 | 72 | 20 | 8 | No crack occurred in all samples | | |
| 20 | 78 | 22 | 72 | 20 | 8 | " | | |
| 21 | 85 | 15 | 72 | 20 | 8 | " | | |
| 22 | 92 | 8 | 72 | 20 | 8 | " | | |
| 23 | 95 | 10 | 72 | 20 | 8 | Cracks occurred in all samples | | Alumina content of ceramics outside the specified range |
| 24 | 78 | $SiO_2$ 20 MgO 2 | 72 | 20 | 8 | No crack occurred in all samples | | |
| 25 | 78 | $SiO_2$ 16 CaO 6 | 72 | 20 | 8 | " | | |
| 26 | 78 | MgO 10 CaO 10 | 72 | 20 | 8 | " | | |
| Reference 1 | 78 | $SiO_2$ 22 | 72 | $PbTiO_3$ 20 | 8 | Cracks occurred in 3/10 of samples | 11.5pf | |

Table 1-continued

| | Sample | | | | Thermal shock test (the state of occurrence of cracks in the sealing glass layer | Electrostatic capacity between nearest leads | Remarks |
|---|---|---|---|---|---|---|---|
| | Composition of ceramics (wt %) | | Composition of Low-melting glass (wt %) | | | | |
| No. | $Al_2O_3$ | $SiO_2$ | lead-borate glass | β-eucryptite | zircon | | | |
| Reference 2 | 78 | $SiO_2$ 22 | 62 | 30 | 8 | No crack occurred in all samples | 15pf | |

The table demonstrates that among samples Nos. 1 to 17 in which the base plate and the frame were made of ceramics having an $Al_2O_3$ content of 72% which is intermediate between 65 and 92% and the remainder (28%) being $SiO_2$ and various proportions of lead borate glass, β-eucryptite and zircon as filler of a low-melting glass for sealing Kovar alloy between the base plate and the frame, samples Nos. 2 to 12 containing the glass ingredients within the above-specified ranges showed a higher thermal shock strength (strength upon repeated heating-cooling) than samples Nos. 1 and 13 to 17 in which the proportions of the lead borate glass, β-eucryptite and zircon were outside the specified ranges.

Of samples Nos. 18 to 23 in which the proportions of $Al_2O_3$ and $SiO_2$ of the ceramics base plate and the ceramics frame were varied while fixing the proportions of the lead borate glass, β-eucryptite and zircon of the low-melting glass at 72%, 20% and 8% which were approximately intermediate in the specified ranges, samples Nos. 19 to 22 produced satisfactory results while samples Nos. 18 and 23 in which the content of $Al_2O_3$ was outside the specified range did not.

Furthermore, samples Nos. 24 to 26 which were obtained by setting the amounts of the lead borate glass, β-eucryptite and zircon of the low-melting glass at 72%, 20% and 8%, respectively, which were substantially intermediate in the specified ranges, adjusting the amount of $Al_2O_3$ in the ceramic base plate and the ceramic frame at 78% which was substantially intermediate in the specified range, and adding 22% of a sintering promoter consisting of $SiO_2$ partly or wholly replaced by alkaline earth metal oxides showed the same thermal shock strength as the corresponding sample No. 4.

The dielectric constant of the low-melting sealing glass, which is important in on LSI package installed long parallelled lead frame, was measured with regard to the electrostatic capacity among the leads. The electrostatic capacity increased in proportion to the amount of the lead borate glass. The maximum value was 5.3 pf in sample No. 10. It was far lower than the low-melting glass consisting of the lead borate glass, lead titanate and zircon described hereinabove. Specifically, the electrostatic capacity between leads of the low-melting glass of reference sample 1, which resulted from replacing 20% of β-eucryptite by 20% of lead titanate in the low-melting glass of samples Nos. 4 and 18 to 23, was 11.5 pf. When Kovar alloy was sealed to a ceramic base plate and a ceramic frame consisting of 78% $Al_2O_3$ and 22% $SiO_2$ as in sample No. 4, the thermal shock strength of the product was unsatisfactory. The reason is as follows: Although the lead titanate incorporated together with zircon in the lead borate glass has a negative coefficient of thermal expansion, the value is about $-60 \times 10^{-7}$ which is far higher than the coefficient of thermal expansion of β-eucryptite used in this invention which is $-120 \times 10^{-7}$. If the amount of the lead titanate is increased to 30% as in reference sample No. 2, the thermal shock strength obtained will be the same as in the present invention, but the electrostatic capacity between leads will further increase.

The seal structure of ceramics and the low-expansion metallic material in accordance with this invention exhibits an especially superior effect in LSI packages shown as examples hereinabove, but they can also be applied to other large-scale seal structures of high alumina ceramics and low-expansion metals. As the low-expansion metal, not only the Kovar alloy, but also other known low-expansion alloys such as 42Ni-Fe alloy having a coefficient of thermal expansion of about $45 \times 10^{-7}$ like Kovar alloy can be used in this invention.

What we claim is:

1. A seal structure of ceramics and a low-expansion metallic material, comprising a high alumina ceramics having an $Al_2O_3$ content of 65 to 92% by weight and a low-expansion metallic material bonded to each other by a low-melting glass consisting of 60 to 85% by weight of a low-melting glass frit of the lead borate type, 10 to 30% by weight of β-eucryptite having a particle size of 40μm or less and 0.5 to 15% by weight of zircon having a particle size of 10μm or less, the total proportion of the glass ingredients being 100% by weight.

2. The seal structure of claim 1 wherein the low-expansion metallic material is selected from the group consisting of an iron-nickel-cobalt alloy and 40-46Ni - iron alloy.

3. The seal structure of claim 1 wherein the ceramics contains 8 to 35% by weight sintering promoters selected from the group consisting of $SiO_2$, MgO, CaO and BaO.

4. The seal structure of claim 3 wherein the sintering promoter is principally $SiO_2$.

5. The seal structure of claim 1 wherein the low-melting lead borate glass comprises 65 to 90% PbO, 3 to 30% $B_2O_3$ and 1 to 30% ZnO.

6. The seal structure of claim 5 wherein the low-melting lead borate glass comprises 68 to 82% PbO, 6 to 12% $B_2O_3$ and 7 to 18% ZnO.

7. The seal structure of claim 1 wherein the lead borate glass has a coefficient of thermal expansion $\alpha = 80 \times 10^{-7}$ to $130 \times 10^{-7}$ °$C^{-1}$ and glass transformation temperature of 250 to 400° C.

* * * * *